(12) United States Patent
Zhao et al.

(10) Patent No.: US 10,235,913 B2
(45) Date of Patent: Mar. 19, 2019

(54) ARRAY SUBSTRATES TESTING CIRCUITS, DISPLAY PANELS, AND FLAT DISPLAY DEVICES

(71) Applicant: Wuhan China Star Optoelectronics Technology Co., Ltd., Wuhan, Hubei (CN)

(72) Inventors: Mang Zhao, Guangdong (CN); Liang Ma, Guangdong (CN)

(73) Assignee: Wuhan China Star Optoelectronics Technology Co., Ltd, Wuhan, Hubei (CN)

( * ) Notice: Subject to any disclaimer, the term of this patent is extended or adjusted under 35 U.S.C. 154(b) by 281 days.

(21) Appl. No.: 15/111,765

(22) PCT Filed: Jun. 12, 2016

(86) PCT No.: PCT/CN2016/085462
§ 371 (c)(1),
(2) Date: Jul. 14, 2016

(87) PCT Pub. No.: WO2017/201773
PCT Pub. Date: Nov. 30, 2017

(65) Prior Publication Data
US 2018/0108285 A1    Apr. 19, 2018

(30) Foreign Application Priority Data

May 23, 2016  (CN) .......................... 2016 1 0345572

(51) Int. Cl.
*G02F 1/13*     (2006.01)
*G01R 31/26*   (2014.01)
(Continued)

(52) U.S. Cl.
CPC ......... *G09G 3/006* (2013.01); *G01R 31/2632* (2013.01); *G01R 31/2637* (2013.01);
(Continued)

(58) Field of Classification Search
CPC ............... G09G 2310/08; G09G 3/006; G09G 2310/0264; G02F 1/13454; G02F 1/13338;
(Continued)

(56) References Cited

U.S. PATENT DOCUMENTS

2014/0232706 A1* 8/2014 Iwasa ................ G02F 1/136213
345/206
2014/0354285 A1* 12/2014 Kim ..................... G09G 3/3233
324/414

(Continued)

FOREIGN PATENT DOCUMENTS

CN     103268744 A     8/2013
CN     104599621 A     5/2015
(Continued)

*Primary Examiner* — Neel D Shah
(74) *Attorney, Agent, or Firm* — Andrew C. Cheng

(57) ABSTRACT

A testing circuit includes at least one sub-circuit. The sub-circuit includes a first input end, at least one second input end, at least one third input end, and at least one driving output end. The first switch unit includes controllable switches. The second switch unit includes sub-units and first inverters. The sub-unit includes transmission gates. The control end of the controllable switch connects to the second input end, the first end connects to the first input end, and the second end connects to the input end of the transmission gate. The first control end of the transmission gate connects to the third input end and the input end of the first inverter, the second control end connects to the output end of the first inverter, the output end connects to the driving output end.

16 Claims, 4 Drawing Sheets

(51) Int. Cl.
  *G09G 3/00*    (2006.01)
  *G02F 1/1368*  (2006.01)
  *G02F 1/1362*  (2006.01)

(52) U.S. Cl.
  CPC ............. *G02F 1/1368* (2013.01); *G09G 3/00* (2013.01); *G02F 2001/136254* (2013.01); *G09G 2310/0251* (2013.01); *G09G 2310/0297* (2013.01); *G09G 2310/08* (2013.01); *G09G 2320/0209* (2013.01); *G09G 2320/0219* (2013.01); *G09G 2320/0223* (2013.01); *G09G 2330/12* (2013.01)

(58) Field of Classification Search
  CPC . G01R 31/26; G01R 31/2632; G01R 31/2637
  See application file for complete search history.

(56) References Cited

U.S. PATENT DOCUMENTS

| | | |
|---|---|---|
| 2015/0008937 A1 | 1/2015 | Lee et al. |
| 2015/0187336 A1 | 7/2015 | Yang et al. |

FOREIGN PATENT DOCUMENTS

| | | |
|---|---|---|
| CN | 104700764 A | 6/2015 |
| CN | 104835466 A | 8/2015 |
| CN | 104952420 A | 9/2015 |
| CN | 105047153 A | 11/2015 |

\* cited by examiner

ARRAY SUBSTRATES TESTING CIRCUITS, DISPLAY PANELS, AND FLAT DISPLAY DEVICES

BACKGROUND OF THE INVENTION

1. Field of the Invention

The present disclosure relates to liquid crystal display technology, and more particularly to a testing circuit of array substrates, a display panel, and a flat display device.

2. Discussion of the Related Art

Currently, flat display devices adopt scanning driving circuit, that is, the scanning driving circuit is formed on the array substrate by conventional array manufacturing process of thin film transistor (TFT) flat display devices. The driving method relates to scanning the rows, and the testing circuits of the array substrate is configured on the array substrate at the same time. After the array substrate is obtained, the electrical testing is applied to the array substrate. However, the controllable switches on the conventional testing circuit of array substrates may dramatically affect the level on the data lines, which causes the distortion of the data signals and thus the pixels cannot be charged to an idealistic level.

SUMMARY

The present disclosure relates to a testing circuit of array substrate, a display panel, and a flat display device to overcome the above-mentioned problem, i.e., the controllable switches on the conventional testing circuit of array substrates may dramatically affect the level on the data lines, which causes the distortion of the data signals. In this way, the pixels may be charged to the idealistic level.

In one aspect, a testing circuit of array substrates includes: at least one sub-circuit having a first input end, at least one second input end, at least one third input end, at least one driving output end, a first switch unit, and a second switch unit, the first input end is configured for receiving data signals, each of the second input ends is configured for receiving first clock signals, each of the third input ends is configured for receiving second clock signals, each of the driving output ends connects to one pixel such that the outputted driving signals charge the pixel, the first switch unit includes controllable switches, and a number of the controllable switches is the same with the number of the second input ends, the second switch unit includes sub-units and first inverters, and the number of the sub-units is the same with the number of the controllable switches, and the number of the first inverters is the same with the number of the third input ends, each of control ends of the controllable switches connects to one second input end, each of the first ends of the controllable switches connects to one first input end, each of the second ends of the controllable switches connects to the input end of each of the transmission gates of one sub-unit, each of first control ends of each of the transmission gates of the sub-units connects to one third input end and the input end of the corresponding first inverters, the second control end of each of the transmission gates of the sub-units connects to an output end of the corresponding first inverters, and the output end of each of the transmission gates connects to one driving output end.

Wherein the transmission gates includes a N-type MOS and a P-type MOS, a gate of the P-type MOS operates as a second control end of the transmission gate, a drain of the P-type connects to the drain of the N-type TFT and operates as an input end of the transmission gate, a source of the P-type TFT connects to the source of the N-type TFT and the source of the P-type TFT operates as an output end of the transmission gate, and the gate of the N-type TFT operates as the first control end of the transmission gate.

Wherein the controllable switch is a N-type MOS TFT, the control end, the first end, and the second end of the controllable switch respectively corresponds to a gate, a drain, and a source of the MOS TFT, or the controllable switch is a P-type MOS TFT, the control end, the first end, and the second end of the controllable switch respectively corresponds to the gate, the drain, and the source of the MOS TFT.

Wherein the sub-unit includes second inverters, and the number of the first inverters is the same with the number of the second inverters, the first inverters and the second inverters are respectively configured at two sides of the sub-units, the first control end of the transmission gates of each of the sub-units connects to a third input end, the input end of the first inverter, and the input end of the second inverter, the second control end of the transmission gates of each of the sub-units connects to the output ends of the corresponding first inverters and of the corresponding second inverters.

In another aspect, a display panel includes: a testing circuit of array substrates, the testing circuit includes at least one sub-circuit having a first input end, at least one second input end, at least one third input end, at least one driving output end, a first switch unit, and a second switch unit, the first input end is configured for receiving data signals, each of the second input ends is configured for receiving first clock signals, each of the third input ends is configured for receiving second clock signals, each of the driving output ends connects to one pixel such that the outputted driving signals charge the pixel, the first switch unit includes controllable switches, and a number of the controllable switches is the same with the number of the second input ends, the second switch unit includes sub-units and first inverters, and the number of the sub-units is the same with the number of the controllable switches, and the number of the first inverters is the same with the number of the third input ends, each of control ends of the controllable switches connects to one second input end, each of the first ends of the controllable switches connects to one first input end, each of the second ends of the controllable switches connects to the input end of each of the transmission gates of one sub-unit, each of first control ends of each of the transmission gates of the sub-units connects to one third input end and the input end of the corresponding first inverters, the second control end of each of the transmission gates of the sub-units connects to an output end of the corresponding first inverters, and the output end of each of the transmission gates connects to one driving output end.

Wherein the transmission gates includes a N-type MOS and a P-type MOS, a gate of the P-type MOS operates as a second control end of the transmission gate, a drain of the P-type connects to the drain of the N-type TFT and operates as an input end of the transmission gate, a source of the P-type TFT connects to the source of the N-type TFT and the source of the P-type TFT operates as an output end of the transmission gate, and the gate of the N-type TFT operates as the first control end of the transmission gate.

Wherein the controllable switch is a N-type MOS TFT, the control end, the first end, and the second end of the controllable switch respectively corresponds to a gate, a drain, and a source of the MOS TFT, or the controllable switch is a P-type MOS TFT, the control end, the first end, and the second end of the controllable switch respectively corresponds to the gate, the drain, and the source of the MOS TFT.

Wherein the sub-unit includes second inverters, and the number of the first inverters is the same with the number of the second inverters, the first inverters and the second inverters are respectively configured at two sides of the sub-units, the first control end of the transmission gates of each of the sub-units connects to a third input end, the input end of the first inverter, and the input end of the second inverter, the second control end of the transmission gates of each of the sub-units connects to the output ends of the corresponding first inverters and of the corresponding second inverters.

In another aspect, a flat display device includes: a display panel comprising a testing circuit of array substrates, the testing circuit includes at least one sub-circuit having a first input end, at least one second input end, at least one third input end, at least one driving output end, a first switch unit, and a second switch unit, the first input end is configured for receiving data signals, each of the second input ends is configured for receiving first clock signals, each of the third input ends is configured for receiving second clock signals, each of the driving output ends connects to one pixel such that the outputted driving signals charge the pixel, the first switch unit includes controllable switches, and a number of the controllable switches is the same with the number of the second input ends, the second switch unit includes sub-units and first inverters, and the number of the sub-units is the same with the number of the controllable switches, and the number of the first inverters is the same with the number of the third input ends, each of control ends of the controllable switches connects to one second input end, each of the first ends of the controllable switches connects to one first input end, each of the second ends of the controllable switches connects to the input end of each of the transmission gates of one sub-unit, each of first control ends of each of the transmission gates of the sub-units connects to one third input end and the input end of the corresponding first inverters, the second control end of each of the transmission gates of the sub-units connects to an output end of the corresponding first inverters, and the output end of each of the transmission gates connects to one driving output end.

Wherein the transmission gates includes a N-type MOS and a P-type MOS, a gate of the P-type MOS operates as a second control end of the transmission gate, a drain of the P-type connects to the drain of the N-type TFT and operates as an input end of the transmission gate, a source of the P-type TFT connects to the source of the N-type TFT and the source of the P-type TFT operates as an output end of the transmission gate, and the gate of the N-type TFT operates as the first control end of the transmission gate.

Wherein the controllable switch is a N-type MOS TFT, the control end, the first end, and the second end of the controllable switch respectively corresponds to a gate, a drain, and a source of the MOS TFT, or the controllable switch is a P-type MOS TFT, the control end, the first end, and the second end of the controllable switch respectively corresponds to the gate, the drain, and the source of the MOS TFT.

Wherein the sub-unit includes second inverters, and the number of the first inverters is the same with the number of the second inverters, the first inverters and the second inverters are respectively configured at two sides of the sub-units, the first control end of the transmission gates of each of the sub-units connects to a third input end, the input end of the first inverter, and the input end of the second inverter, the second control end of the transmission gates of each of the sub-units connects to the output ends of the corresponding first inverters and of the corresponding second inverters.

Wherein the flat display device is a liquid crystal device (LCD) or an organic light emitting display (OLED).

In view of the above, the testing circuit of the array substrate multiplexes one-way data signals into multiple-ways data signals via the first switch unit and the second switch unit so as to charge the pixels. In addition, the capacitance coupling effect caused by the second switch unit is offset by adopting the transmission gate and the inverter within the second switch unit. The first switch unit is turned off after the second switch unit is turned off so as to prevent the data signals from distortion caused by the first and the second switch unit. As such, the pixels may be charged to the idealistic level.

DETAILED DESCRIPTION OF THE EMBODIMENTS

Embodiments of the invention will now be described more fully hereinafter with reference to the accompanying drawings, in which embodiments of the invention are shown.

Figure 1:
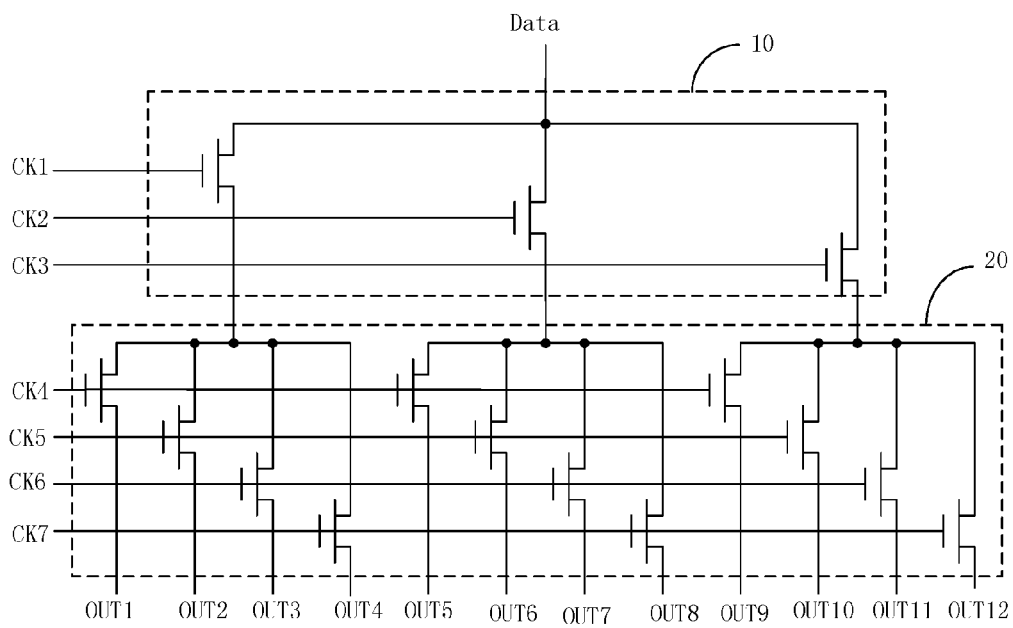
FIG. 1 is a schematic view of one conventional testing circuit of array substrates.

FIG. 1 is a schematic view of one conventional testing circuit of array substrates. The number of the data signal lines on the testing circuit is limited, and thus, when the limited number of the data signal line is adopted to test the whole array substrate, two switch circuits have to be configured, that is, a first switch unit 10 and a second switch unit 20. One data signal line (Data) of the testing circuit on the array substrate outputs the data signals, and the data signals are multiplexed by the first switch unit 10 and the clock signals (CK1, CK2, CK3) such that the one-way data signals are transformed into three-ways data signals. Afterward, the data signals processed by the first switch unit 10 enter the second switch unit 20, and the clock signals (CK4, CK5, CK6, CK7) are multiplexed such that the one-way data signals are transformed into four-ways data signals. That is, the one-way data signals outputted from the data signal line (Data) are transformed into the three-ways data signals after passing the first switch unit 10. The three-ways data signals are transformed into twelve-ways data signals after passing the second switch unit 20 so as to charge the twelve pixels.

Figure 2:
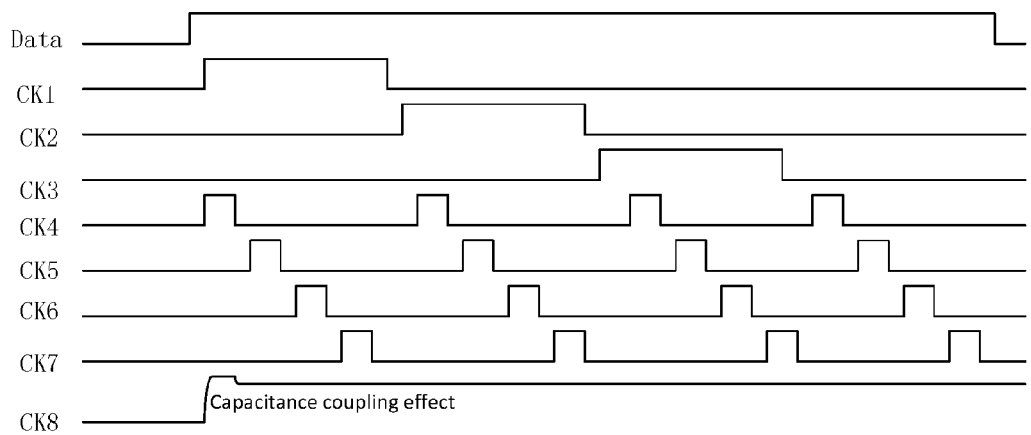
FIG. 2 is a waveform diagram of the conventional testing circuit of array substrates.

FIG. 2 is a waveform diagram of the conventional testing circuit of array substrates. As shown in FIG. 2, the data signals may be distorted after being multiplexed by the testing circuit of FIG. 1, and the idealistic level cannot be maintained, wherein the data signals are distorted when the clock signals (CK4, CK5, CK6, CK7) transition from the high level to the low level within the second switch unit 20, and the distortion is caused by the parasitic capacitance of the TFT within the second switch unit 20.

Figure 3:
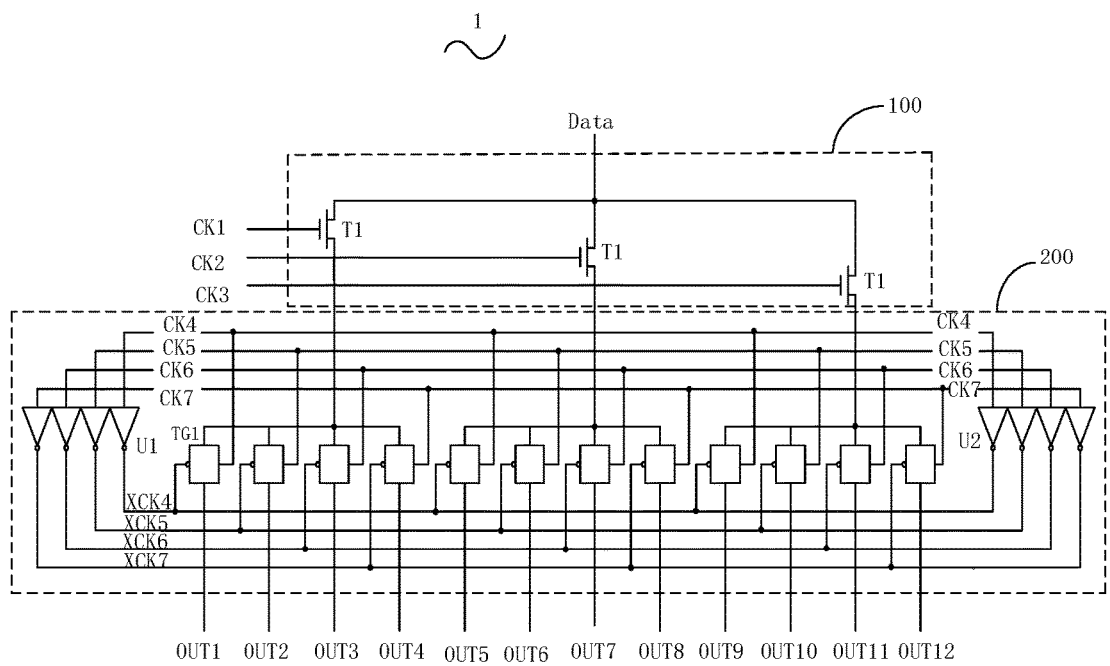
FIG. 3 is a schematic view of the testing circuit of array substrates in accordance with a first embodiment.

FIG. 3 is a schematic view of the testing circuit of array substrates in accordance with a first embodiment. Only one sub-circuit 1 of the testing circuit connected with one data signals is taken as one example. As shown in FIG. 3, the testing circuit of array substrates includes at least one sub-circuit 1 having a first input end, at least one second input end, at least one third input end, at least one driving output end, a first switch unit 100, and a second switch unit 200. The first input end is configured for receiving data signals from one data signal line (Data), each of the second input ends is configured for receiving first clock signals, each of the third input ends is configured for receiving second clock signals, each of the driving output ends connects to one pixel such that the outputted driving signals charge the pixel. The first switch unit 100 includes controllable switches (T1), and the number of the controllable switches (T1) is the same with the number of the second input ends. The second switch unit 200 includes sub-units 210 and first inverters (U1), and the number of the sub-units 210 is the same with the number of the controllable switches (T1), and the number of the first inverters (U1) is the same with the number of the third input ends. Each of the sub-units 210 includes transmission gates (TG1), and the number of the transmission gates (TG1) is the same with the number of the third input ends. Each of the control ends of the controllable switches (T1) connects to one second input end, each of the first ends of the controllable switches (T1) connects to one first input end, each of the second ends of the controllable switches (T1) connects to the input end of each of the transmission gates (TG1) of one sub-unit 210, each of the first control ends of each of the transmission gates (TG1) of the sub-units 210 connects to one third input end and the input end of one first inverters (U1). The second control end of each of the transmission gates (TG1) of the sub-units 210 connects to the output end of the corresponding first inverters (U1), and the output end of each of the transmission gates (TG1) connects to one driving output end.

In the first embodiment, the controllable switch (T1) is a N-type MOS TFT, the control end, the first end, and the second end of the controllable switch (T1) respectively corresponds to a gate, a drain, and a source of the MOS TFT. In other embodiments, the controllable switches may be the switch of other types provided that the technical solution may be accomplished.

The sub-unit 210 includes second inverters (U2), and the number of the first inverters (U1) is the same with the number of the second inverters (U2). In the first embodiment, the number of the second inverters (U2) is four. The first inverters (U1) and the second inverters (U2) are respectively configured at two sides of the sub-units 210. The first control end of the transmission gates (TG1) of each of the sub-units 210 connects to a third input end, the input end of the first inverter (U1), and the input end of the second inverter (U2), the second control end of the transmission gates (TG1) of each of the sub-units 210 connects to the output ends of the corresponding first inverters (U1) and of the second inverters (U2). In the embodiment, the second inverters (U2) are configured such that the transmission gates (TG1) may be better controlled. In other embodiments, the second inverters (U2) may be excluded, and thus only the first inverters (U1) are configured.

Figure 4:
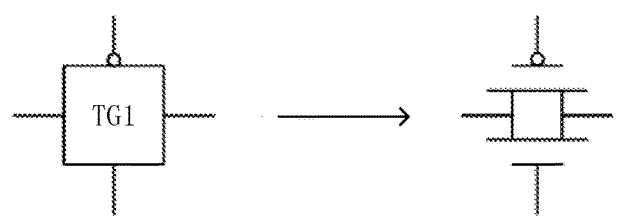
FIG. 4 is a schematic view showing the transmission gate of FIG. 3.

FIG. 4 is a schematic view showing the transmission gate of FIG. 3. As shown in FIG. 4, the transmission gates (TG1) includes a N-type MOS and a P-type MOS. The gate of the P-type MOS operates as the second control end of the transmission gates (TG1), the drain of the P-type connects to the drain of the N-type TFT and operates as the input end of the transmission gate (TG1), the source of the P-type TFT connects to the source of the N-type TFT and the source of the P-type TFT operates as the output end of the transmission gate (TG1), and the gate of the N-type TFT operates as the first control end of the transmission gate (TG1).

In other embodiment, the number of the second input end, the third input end, the controllable switch, and the transmission gate may be configured in accordance with real scenarios.

The operations of the sub-circuit 1 of the testing circuit is taken as one example, wherein the controllable switch (T1) of the first switch unit 100 and the transmission gate (TG1) and the first inverters (U1) of the second switch unit 200 are described below.

The control end of the controllable switch (T1) of the first switch unit 100 receives the high level signals outputted from the clock signals (CK1) via the second input end, the controllable switch (T1) is turned on. At this moment, the data signals outputted from the data signal line (Data) connected with the first input end enter the input end of the transmission gate (TG1) of the second switch unit 200 via the controllable switch (T1). When the third input end receives the high level signals from the clock signals (CK4), the first control end of the transmission gate (TG1) receives the high level signals. The high level signals are provided to the first inverter (U1), and are then converted into the low level signals. The low level signals are provided to the second control end of the transmission gate (TG1). At this moment, the transmission gate (TG1) is turned on. The data signals received by the input end of the transmission gate (TG1) are provided to the pixels to charge the pixels via the output end of the transmission gate (TG1) and the driving output end. As the transmission gate (TG1) includes one N-type TFT and one P-type TFT, the N-type TFT and the P-type TFT are complementary. Thus, when the transmission gate (TG1) is turned off, the N-type TFT may cause the capacitance coupling effect reducing the level of the data line. At the same time, the P-type TFT may cause the capacitance coupling effect increasing the level of the data line. When the dimension of the N-type TFT is the same with that of the P-type TFT, the parasitic capacitance are the same. Thus, the effect toward the data line may be offset. That is, the level of the data line may not be affected regardless whether the transmission gate is turned on or off. When the clock signals outputted by the third input end is multiplexed, the controllable switch of the first switch unit 100 is turned off. At this moment, the transmission gate of the second switch unit 200 is turned off, and the level of the clock signals outputted by the second output end may not affect the level of the data line. That is, the controllable switch of the first switch unit 100 may not affect the level of the driving output end of the controllable switch, and the transmission gate of the second switch unit 200 may not affect the level of the driving output end. In this way, the data signals are prevented from distortion, and the pixels may be charged to be the idealistic level.

Figure 5:
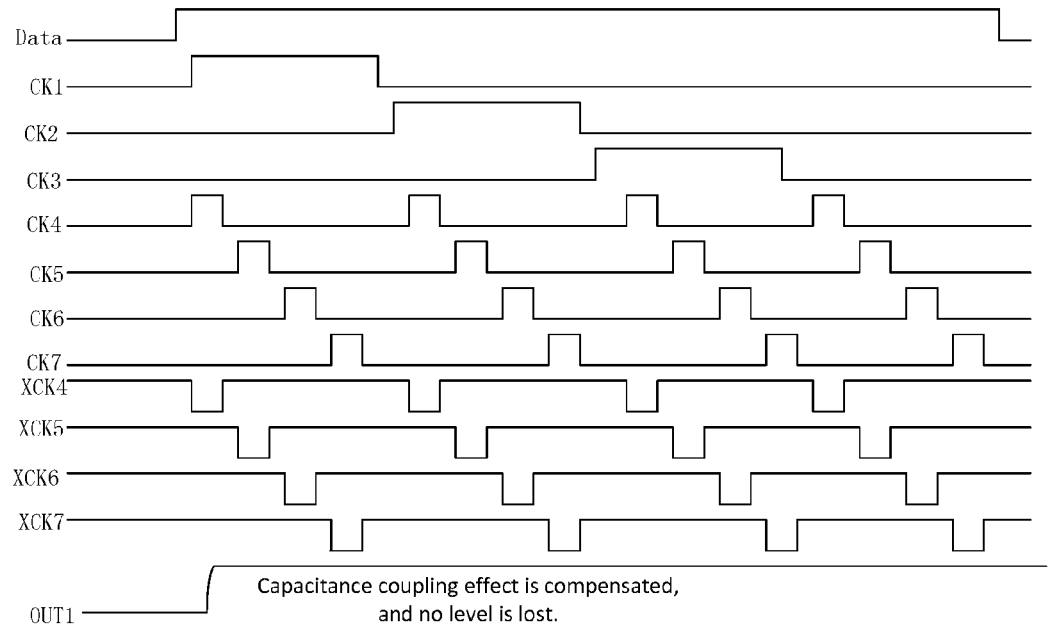
FIG. 5 is a waveform diagram of the testing circuit of array substrates in accordance with one embodiment.

FIG. 5 is a waveform diagram of the testing circuit of array substrates in accordance with one embodiment. As shown in FIG. 5, when the transmission gate of the second switch unit 200 controls the testing circuit of the array substrate, the data signals outputted from the driving output end to the pixel may not be distorted. When the transmission gate of the second switch unit 200 is turned off, the level of the data signals outputted by the driving output end may not be affected regardless of whether the controllable switch of the first switch unit 100 is turned on or off.

Figure 6:
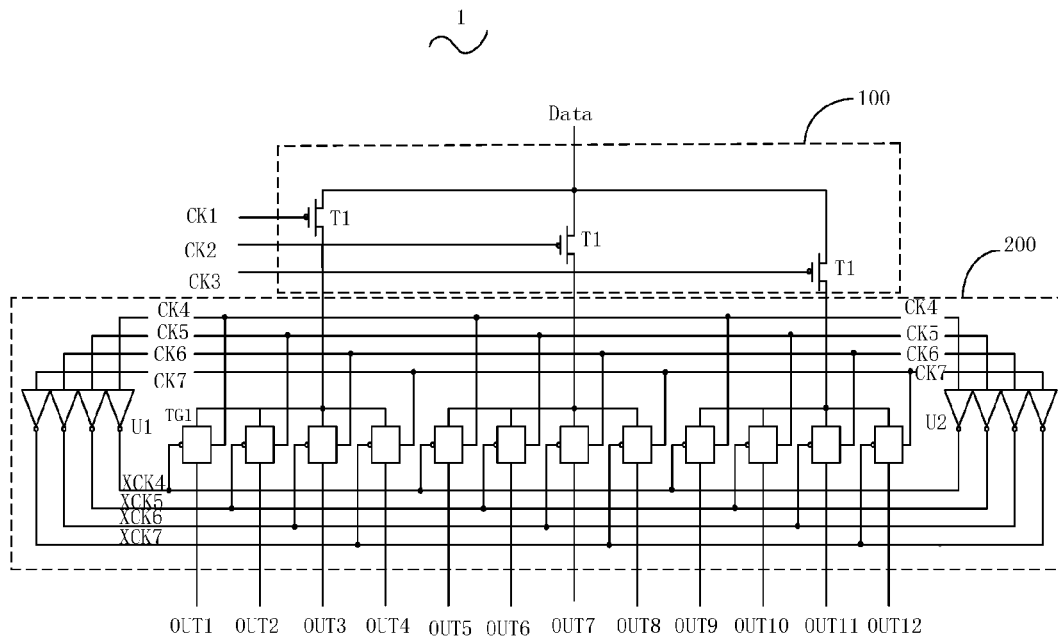
FIG. 6 is a schematic view of the testing circuit of array substrates in accordance with a second embodiment.

FIG. 6 is a schematic view of the testing circuit of array substrates in accordance with a second embodiment. The difference between the first embodiment and the second embodiment will be described hereinafter. The controllable switch of the first switch unit 100 may be the P-type TFT, and the control end, the first end, and the second end of the controllable switch correspond to the gate, the drain, and the source of the MOS TFT. The connection relationship and the operations of the controllable switch are the same with that of the first embodiment, and thus are omitted hereinafter.

Figure 7:
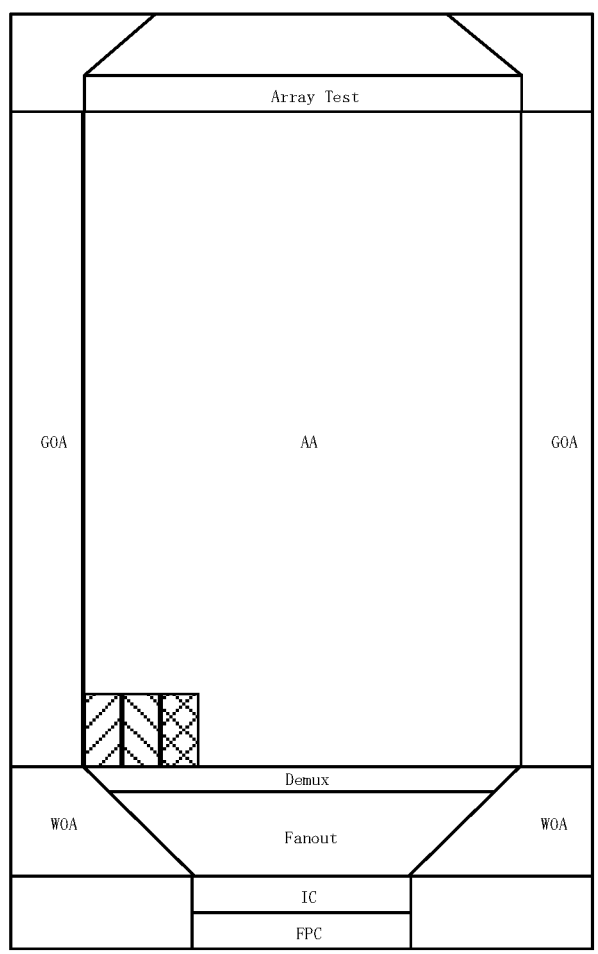
FIG. 7 is a schematic view of the display panel in accordance with one embodiment.

FIG. 7 is a schematic view of the display panel in accordance with one embodiment. The display panel includes the above testing circuit of the array substrate, and the testing circuit is arranged in an Array Test area on top of the display panel. The display panel also includes a AA area, a GOA (gate on array) area, a Fan-out area, a Demux area, a WOA (Wire on Array) area, an IC area, and a FPC area, wherein the Array Test area is configured for testing the electrical performance of the array substrate after the array substrate is completed, the AA area is configured for displaying the pixels, the GOA area is configured for generating gate driving signals for the TFTs within the display panel, the Fan-out area is configured for connecting at least one chip and the wirings within the AA area, the Demux area is configured for dividing the data line pulled from the chip toward a plurality of data lines, the WOA area is configured for connecting the wirings in a rim of the display panel, and the FPC area is configure for welding the flexible circuit board so as to connect to a main board.

Figure 8:
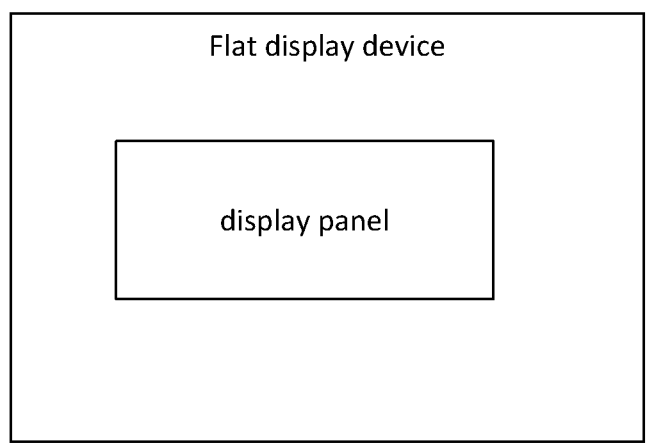
FIG. 8 is a schematic view of the flat display device in accordance with one embodiment.

FIG. 8 is a schematic view of the flat display device in accordance with one embodiment. The flat display device includes the above display panel, wherein the flat display device is a LCD or OLED.

In view of the above, the testing circuit of the array substrate multiplexes one-way data signals into multiple-ways data signals via the first switch unit and the second switch unit so as to charge the pixels. In addition, the capacitance coupling effect caused by the second switch unit is offset by adopting the transmission gate and the inverter within the second switch unit. The first switch unit is turned off after the second switch unit is turned off so as to prevent the data signals from distortion caused by the first and the second switch unit. As such, the pixels may be charged to the idealistic level.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A testing circuit of array substrates, comprising:
at least one sub-circuit having a first input end, a plurality of second input ends, a plurality of third input ends, a plurality of driving output ends, a first switch unit, and a second switch unit, the first input end is configured for receiving a data signal, the second input ends are configured for receiving first clock signals respectively, the third input ends are configured for receiving second clock signals respectively, each of the driving output ends connects to a corresponding one pixel such that outputted driving signals charge pixels respectively by the driving output ends, the first switch unit comprises controllable switches, and a number of the controllable switches is the same with a number of the second input ends and less than a number of the driving output ends, and a number of the third input ends is less than the number of the driving output ends, the second switch unit comprises sub-units and first inverters, and a number of the sub-units is the same with the number of the controllable switches, and a number of the first inverters is the same with a number of the third input ends, each of the sub-units comprises a plurality of transmission gates, and each of control ends of the controllable switches connects to one second input end, each of the first ends of the controllable switches connects to the first input end, each of the second ends of the controllable switches connects to input ends of the transmission gates of a corresponding one sub-unit, a first control end of each of the transmission gates of the corresponding one sub-unit connects to one third input end and an input end of a corresponding one first inverter, a second control end of each of the transmission gates of the corresponding one sub-unit connects to an output end of the corresponding one first inverter, and an output end of each of the transmission gates connects to one driving output end, the number of the driving output ends is equal to a product of the number of the second input ends and the number of the third input ends.

2. The testing circuit of array substrates as claimed in claim 1, wherein each of the transmission gates comprises a N-type MOS and a P-type MOS, a gate of the P-type MOS operates as the second control end of each of the transmission gates, a drain of the P-type connects to a drain of the N-type TFT and operates as the input end of each of the transmission gates, a source of the P-type TFT connects to a source of the N-type TFT and the source of the P-type TFT operates as the output end of each of the transmission gates, and a gate of the N-type TFT operates as the first control end of each of the transmission gates.

3. The testing circuit of array substrates as claimed in claim 1, wherein each of the controllable switches is a N-type MOS TFT, each of the control ends, each of the first ends, each of and the second ends of the controllable switches respectively corresponds to a gate, a drain, and a source of the N-type MOS TFT, or each of the controllable switches is a P-type MOS TFT, each of the control ends, each of the first ends, and each of the second ends of the controllable switches respectively corresponds to a gate, a drain, and a source of the P-type MOS TFT.

4. The testing circuit of array substrates as claimed in claim 1, wherein the second switch further comprises second inverters, and the number of the first inverters is the same with a number of the second inverters, the first inverters and the second inverters are respectively configured at two sides of the sub-units, an input end of each of the first inverters, and an input end of each of the second inverters, the second control end of each of the transmission gates of the corresponding one sub-unit connects to the output end of the corresponding one first inverter and of a corresponding one second inverter.

5. The testing circuit of array substrates as claimed in claim 1, wherein during the enable period of the second input end, first enable signals are sequentially received by corresponding third input ends, and second enable signals are sequentially received by corresponding output ends of the first inverters; one of the first enable signals starts to be received when the prior one finishes being received, and a last one first enable signals of the third input ends is simultaneously finished with the enable period of the second input end; and each of the second enable signals is received at a same time with a corresponding one of the first enable signals of the third input ends.

6. A display panel, comprising:
a testing circuit of array substrates, the testing circuit comprises at least one sub-circuit having a first input end, a plurality of second input ends, a plurality of third input ends, a plurality of driving output ends, a first switch unit, and a second switch unit, the first input end is configured for receiving a data signal, the second input ends are configured for receiving first clock signals respectively, the third input ends are configured for receiving second clock signals respectively, each of the driving output ends connects to a corresponding one pixel such that outputted driving signals charge pixels respectively by the driving output ends, the first switch unit comprises controllable switches, and a number of the controllable switches is the same with a number of the second input ends and less than a number of the driving output ends, and a number of the third input ends is less than the number of the driving output ends, the second switch unit comprises sub-units and first inverters, and a number of the sub-units is the same with the number of the controllable switches, and a number of the first inverters is the same with a number of the third input ends, each of the sub-units comprises a plurality of transmission gates, and each of control ends of the controllable switches connects to one second input end, each of the first ends of the controllable switches connects to the first input end, each of the second ends of the controllable switches connects to input ends of the transmission gates of a corresponding one sub-unit, a first control end of each of the transmission gates of the corresponding one sub-unit connects to one third input end and an input end of a corresponding one first inverter, a second control end of each of the transmission gates of the corresponding one sub-unit connects to an output end of the corresponding one first inverter, and an output end of each of the transmission gates connects to one driving output end, the number of the driving output ends is equal to a product of the number of the second input ends and the number of the third input ends.

7. The display panel as claimed in claim 6, wherein each of the transmission gates comprises a N-type MOS and a P-type MOS, a gate of the P-type MOS operates as the second control end of each of the transmission gates, a drain of the P-type connects to a drain of the N-type TFT and operates as the input end of each of the transmission gates, a source of the P-type TFT connects to a source of the N-type TFT and the source of the P-type TFT operates as the output end of each of the transmission gates, and a gate of the N-type TFT operates as the first control end of each of the transmission gates.

8. The display panel as claimed in claim 6, wherein each of the controllable switches is a N-type MOS TFT, each of the control ends, each of the first ends, each of and the second ends of the controllable switches respectively corresponds to a gate, a drain, and a source of the N-type MOS TFT, or each of the controllable switches is a P-type MOS TFT, each of the control ends, each of the first ends, and each of the second ends of the controllable switches respectively corresponds to a gate, a drain, and a source of the P-type MOS TFT.

9. The display panel as claimed in claim 6, wherein the second switch further comprises second inverters, and the number of the first inverters is the same with a number of the second inverters, the first inverters and the second inverters are respectively configured at two sides of the sub-units, an input end of each of the first inverters, and an input end of each of the second inverters, the second control end of each of the transmission gates of the corresponding one sub-unit connects to the output end of the corresponding one first inverter and of a corresponding one second inverter.

10. The display panel as claimed in claim 6, wherein during the enable period of the second input end, first enable signals are sequentially received by corresponding third input ends, and second enable signals are sequentially received by corresponding output ends of the first inverters; one of the first enable signals starts to be received when the prior one finishes being received, and a last one first enable signals of the third input ends is simultaneously finished with the enable period of the second input end; and each of the second enable signals is received at a same time with a corresponding one of the first enable signals of the third input ends.

11. A flat display device, comprising:
a display panel comprising a testing circuit of array substrates, the testing circuit comprises at least one sub-circuit having a first input end, a plurality of second input ends, a plurality of third input ends, a plurality of driving output ends, a first switch unit, and a second switch unit, the first input end is configured for receiving a data signal, the second input ends are configured for receiving first clock signals respectively, the third input ends are configured for receiving second clock signals respectively, each of the driving output ends connects to a corresponding one pixel such that outputted driving signals charge pixels respectively by the driving output ends, the first switch unit comprises controllable switches, and a number of the controllable switches is the same with a number of the second input ends and less than a number of the driving output ends, and a number of the third input ends is less than the number of the driving output ends, the second switch unit comprises sub-units and first inverters, and a number of the sub-units is the same with the number of the controllable switches, and a number of the first inverters is the same with a number of the third input ends, each of the sub-units comprises a plurality of transmission gates, and each of control ends of the controllable switches connects to one second input end, each of the first ends of the controllable switches connects to the first input end, each of the second ends of the controllable switches connects to input ends of the transmission gates of a corresponding one sub-unit, a first control end of each of the transmission gates of the corresponding one sub-unit connects to one third input end and an input end of a corresponding one first inverter, a second control end of each of the transmission gates of the corresponding one sub-unit connects to an output end of the corresponding one first inverter, and an output end of each of the transmission gates connects to one driving output end, the number of the driving output ends is equal to a product of the number of the second input ends and the number of the third input ends.

12. The flat display device as claimed in claim 11 wherein each of the transmission gates comprises a N-type MOS and a P-type MOS, a gate of the P-type MOS operates as the second control end of each of the transmission gates, a drain of the P-type connects to a drain of the N-type TFT and operates as the input end of each of the transmission gates, a source of the P-type TFT connects to a source of the N-type TFT and the source of the P-type TFT operates as the output end of each of the transmission gates, and a gate of the N-type TFT operates as the first control end of each of the transmission gates.

13. The flat display device as claimed in claim 11, wherein each of the controllable switches is a N-type MOS TFT, each of the control ends, each of the first ends, each of and the second ends of the controllable switches respectively corresponds to a gate, a drain, and a source of the N-type MOS TFT, or each of the controllable switches is a P-type MOS TFT, each of the control ends, each of the first ends, and each of the second ends of the controllable switches respectively corresponds to a gate, a drain, and a source of the P-type MOS TFT.

14. The flat display device as claimed in claim 11, wherein the second switch further comprises second inverters, and the number of the first inverters is the same with a number of the second inverters, the first inverters and the second inverters are respectively configured at two sides of the sub-units, an input end of each of the first inverters, and an input end of each of the second inverters, the second control end of each of the transmission gates of the corresponding one sub-unit connects to the output end of the corresponding one first inverter and of a corresponding one second inverter.

15. The flat display device as claimed in claim 11, wherein the flat display device is a liquid crystal device (LCD) or an organic light emitting display (OLED).

16. The flat display device as claimed in claim 11, wherein during the enable period of the second input end, first enable signals are sequentially received by corresponding third input ends, and second enable signals are sequentially received by corresponding output ends of the first inverters; one of the first enable signals starts to be received when the prior one finishes being received, and a last one first enable signals of the third input ends is simultaneously finished with the enable period of the second input end; and each of the second enable signals is received at a same time with a corresponding one of the first enable signals of the third input ends.

* * * * *